United States Patent [19]

Baba

[11] Patent Number: 5,751,063
[45] Date of Patent: May 12, 1998

[54] MULTI-CHIP MODULE

[75] Inventor: Mikio Baba, Tokyo, Japan

[73] Assignee: NEC Corporation, Japan

[21] Appl. No.: 714,675

[22] Filed: Sep. 16, 1996

[30] Foreign Application Priority Data

Sep. 18, 1995 [JP] Japan ................... 7-238015

[51] Int. Cl.⁶ ................ H01L 23/34; H01L 23/02; H01L 23/10
[52] U.S. Cl. ................... 257/723; 257/685; 257/686; 257/706; 257/712; 361/719; 361/720; 361/736; 361/784
[58] Field of Search ................... 257/723, 706, 257/686, 777, 685; 361/719, 720, 736, 784

[56] References Cited

U.S. PATENT DOCUMENTS 5,222,014  6/1993  Lin .......................... 361/721
5,237,204  8/1993  Val .......................... 257/698
5,444,296  8/1995  Kaul et al. ................. 257/686
5,543,663  8/1996  Takubo ..................... 257/720
5,567,983  10/1996 Hirano et al. ............... 257/722
5,633,783  5/1997  Yamamoto ................. 361/704

Primary Examiner—Teresa M. Arroyo
Attorney, Agent, or Firm—Hayes, Soloway, Hennessey, Grossman & Hage, P.C.

[57] ABSTRACT

Disclosed is a multi-chip module. According to the present invention, the multi-chip module comprises: a first insulating board having a first surface and a second surface that is positioned opposite to the first surface; at least one semiconductor chip mounted on the first surface of the first insulating board; a plurality of metal connection members arranged on the second surface of the first insulating board; a second insulating board that is connected to the plurality of metal connection members; a metal plate that is securely attached to one part of the second surface of the first insulating board through an opening in the second insulating board; and electric components mounted on a surface of the second insulating board.

5 Claims, 6 Drawing Sheets

MULTI-CHIP MODULE

BACKGROUND OF THE INVENTION

1. Field of the Invention

The present invention relates to a multi-chip module wherein a semiconductor chip, together with various other electric components, is mounted on a printed board, and to a manufacturing method thereof.

2. Description of the Prior Art

In consonance with recent general reductions in the sizes and the weights of electronic equipment components, from a variety of fields have arisen increasing demands for semiconductor packages that are surface mounted, that have reduced prices, that have a greater number of pins, and that have higher speeds and better heat dissipation capabilities. Relative to the demand for packages having a greater number of pins, BGAs (Ball Grid Arrays) have been especially requested, since mounting a BGA is easier than mounting a QFP (Quad Flat Package) and since a BGA can more readily accept an increase in the number of pins. The BGA is also regarded as having electric characteristics and thermal characteristics that are superior to those of the QFP, and thus it is anticipated that using it will provide an adequate response for application requests.

For a multi-chip module (hereinafter referred to simply as an MCM) on which a conventional BGA is mounted, as is shown in FIGS. 1 and 2, electric components, i.e., molded packages 8, such as various memories and a microcomputer, and chips 9, such as chip capacitors, and a face-up BGA and a face-down BGA, are mounted on two surfaces of a printed board 11 and are soldered in place using an infrared reflow device, etc.

FIG. 1 is a vertical-selectional view showing a face-up ceramic BGA (hereinafter referred to as an F/U C.BGA) mounted on the printed board 11, and FIG. 2 is a vertical-sectional view showing a face-down plastic BGA (hereinafter referred to as an F/D P.BGA).

In FIG. 1, a semiconductor chip 5 is mounted on a F/U C.BGA 1, which is a first insulating board on which is laid down a wiring pattern (not shown). The wiring pattern for the F/U C.BGA 1 is connected to the semiconductor chip 5 by fine metal cables 6, such as wires. At the bottom of the F/U C.BGA 1, the wiring pattern is connected to a pad (not shown). A soldering material, such as gold solder, is used to braze the F/U C.BGA 1 and a cap 4 together, and solder balls 10 are formed along the bottom of the pad to provide a first insulating board assembly.

The molded package components 8, such as memory and a microcomputer; the chip components 9, such as a chip capacitor; and the first insulating board assembly using the above described F/U C.BGA 1 are mounted on individual portions of the wiring pattern on the printed board 11 to provide a second insulating board assembly. An infrared reflow device, etc., are used to solder these components to the printed board 11.

In the MCM shown in FIG. 1, when the semiconductor chip 5 is a chip that generates a large amount of heat, an aluminum nitride board that has a preferable thermal conductivity is to be used as the material for the F/U C.BGA 1. However, since this board is expensive, generally, an alumina board is used. When alumina is employed, heat is discharged with the solder balls 10 through a thermal via (not shown), so that only a limited amount of heat is released. It is currently difficult to mount a high heat dissipation semiconductor chip on the F/U C.BGA 1.

In addition, although not shown, a heat release method using the same thermal via as that for the F/U C.BGA 1 is generally used as a printed board mounting method for a face-up plastic BGA (hereinafter referred to as an F/U P.BGA). The heat release property of the plastic BGA is inferior to that of the ceramic BGA.

On the other hand, according to an MCM shown in FIG. 2, a semiconductor chip 5 is mounted on a metal plate 14 formed of copper, etc., that is attached to an F/D P.BGA 3, which is a first insulating board on which is laid down a wiring pattern (not shown). The wiring pattern is connected to the semiconductor chip 5 by fine metal cables 6, such as wires, and to a pad (not shown) that contacts the lower circumferential external surface of the F/D P.BGA 3. The F/D P.BGA 3 is sealed by a resin 12, such as an epoxy resin, and solder balls 10 are formed and connected to the pad. As is shown in FIG. 2, the solder balls 10 are arranged around the opening for the semiconductor chip 5 in the surface of the board, on which the semiconductor chip 5 is mounted. In this manner, a first insulating board assembly using the F/D P.BGA 3 is constructed.

Then, in the same manner as in FIG. 1, electric components 8 and 9 and the first insulating board assembly for which the F/D P.BGA 3 is used are mounted on individual portions of the wiring pattern laid down on a printed board 11, which constitutes a second insulating board, and these components are soldered in place using an infrared reflow device, etc.

The MCM in FIG. 2 provides a heat release capability that is superior to that provided by the MCM in FIG. 1, and is the configuration that is generally adopted for a semiconductor chip that generates much heat. However, since the solder balls 10, which serve as connection electrodes for the first and the second insulating boards, are positioned separately from and around the semiconductor chip 5, the arrangement of the solder balls 10 is limited. And as the number of pins is increased, the package for the first insulating board becomes larger in turn, and it is difficult to make it compact.

The MCMs shown in FIGS. 1 and 2 can be acquired by the surface mounting of chip components and various packages using soldering, by employing simple, common manufacturing procedures. Of the wiring patterns on the printed board, only wiring portions 11W to which the electric components 8 and 9 are connected are shown in FIGS. 1 and 2, and wiring portions to which the F/U C.BGA 1 and the F/D P.BGA 3 are connected by the solder balls 10 are not shown.

A highly effective heat dissipation MCM that does not employ a BGA is constructed as is shown in FIG. 3, by employing the process shown in a flowchart in FIG. 4.

A semiconductor chip 5, which is constituted by logical circuit devices, such as a central processing unit (CPU) that generates much heat and a floating-point processing unit (FPU), is mounted on a metal plate 14, which is formed of copper and tungsten and which is brazed to a ceramic board 7 on which is laid down a wiring pattern (procedure for "mounting a semiconductor chip on a ceramic board" (F-1) in FIG. 4). The wiring pattern portion (not shown) on the ceramic board 7 is connected to the semiconductor chip 5 by fine metal cables 6, such as wires (procedure for "wire bonding between the semiconductor chip and the ceramic board" (F-2) in FIG. 4). The wiring pattern on the ceramic board is connected to external leads 17. Among the external leads, there is an external lead 17A that has a stopper 18. The ceramic board 7 is sealed by a cap 4 using a soldering material, such as gold solder (procedure for "sealing the ceramic board" (F-3) in FIG. 4). Following this, the checking of the semiconductor chip 5 that is mounted on the ceramic board 7 is performed (procedure for "checking the semiconductor chip whether the semiconductor is normal or not" (F-4) in FIG. 4). A package that is determined to have no defects is printed with a soldering paste (not shown), and molded package components 8, such as memory, that generate comparatively little heat and for which quality is guaranteed; and chip components 9, such as a chip resistor and a chip capacitor, are mounted on the ceramic board 7 (procedure for "supplying mold package components" (F-5A) and "supplying chip components" (F-5B) in FIG. 4, and procedure for "mounting the molded package components and chip components on the ceramic board" (F-5C) in FIG. 4). The resultant structure is then secured using soldering by an infrared reflow device (a procedure for "soldering by infrared reflow" (F-6) in FIG. 4). The checking of the MCM is thereafter performed (a procedure for "checking the MCM whether the MCM is normal or not" (F-7A) in FIG. 4). Then, using a high thermal conductive adhesive 15, a heat sink 16 is bonded to the surface of the MCM that is regarded as a product that has no defects, opposite to the surface on which the semiconductor chip 5 is mounted (a procedure for "attaching a heat sink" (F-8) in FIG. 4).

The thus constructed MCM is employed for a processing apparatus, such as a workstation, and as a unit for which high speed processing is most strongly required. This construction is appropriate for an MCM that employs a semiconductor chip that generates much heat.

As is described above, it is difficult for the MCM shown in FIG. 1 to mount a semiconductor chip that generates much heat. Further, it is difficult for the MCM in FIG. 2 to be made compactly.

Since the general surface mounting technique using soldering is employed to construct the high heat release MCM in FIG. 3, the exchange of defective molded package components and chip components is easy. However, when the semiconductor chip 5 mounted on the ceramic board 7 has defects that may include a mounting failure or a wire bonding failure, i.e., when the semiconductor chip 5 is regarded as being a defective product, at the "semiconductor chip checking" procedure (F-4) or the "MCM checking" procedure (F-7A) in FIG. 4, many procedures tend to be required for the method for recycling the ceramic board 7, and the expensive MCM ceramic board 7 tends to be abandoned. Further, since the size of the ceramic board in this structure is large, the ceramic board 7 tends to crack due to high heat when the semiconductor chip 5 is to be mounted. In addition, the MCM manufacturing method in FIG. 3 requires a long manufacture TAT (Turn Around Time), as is shown in the manufacturing procedures in FIG. 4.

SUMMARY OF THE INVENTION

To overcome the above shortcomings, it is an object of the present invention to provide an MCM, in which can be mounted a semiconductor chip that generates much heat, for which the size can be easily reduced, that permits a defective semiconductor chip to be exchanged without a ceramic board being abandoned, that prevents cracks in the ceramic board by reducing the size of the board, and for which the TAT can be reduced; and to provide a method for manufacturing such an MCM.

To achieve the above object, according to a first aspect of the present invention, provided is a multi-chip module comprising: a first insulating board having a first surface and a second surface that is positioned opposite to the first surface; at least one semiconductor chip mounted on the first surface of the first insulating board; a plurality of metal connection members arranged on the second surface of the first insulating board; a second insulating board that is connected to the plurality of metal connection members; a metal plate that is securely attached to one part of the second surface of the first insulating board through an opening in the second insulating board; and electric components mounted on a surface of the second insulating board.

It is preferable that the metal connection members be solder balls. A recessed portion is formed in the first insulating board and the bottom of the recessed portion is the first surface on which the semiconductor chip is mounted. Further, the semiconductor chip can be sealed by using a cap or can be sealed by using a resin.

According to a second aspect of the present invention, provided is a multi-chip module manufacturing method comprising the steps of: constructing a first insulating board assembly by performing a processing sequence for mounting a semiconductor chip on a first insulating board on which a plurality of metal connection members are arranged, and for electrically connecting the semiconductor chip to a wiring layer, which is connected to the metal connection members and which is formed on the first insulating board; connecting the metal connection members to a portion of a wiring pattern that is positioned around a through hole in a second insulating board so as to fix the first insulating board assembly to the second insulating board, and connecting surface-mounting electric components to other portions of the wiring pattern of the second insulating board; and attaching a heat release metal plate to one part of the first insulating board through the through hole in the second insulating board.

In this case, it is preferable that inspection be performed after the first insulating board assembly and the electric components are connected to the second insulating board, and that defective products included in the first insulating board assembly and the electric components be replaced, and that attachment of the high heat release metal plate be performed.

Since the MCM according to the above aspects of the present invention is so constructed that at least one semiconductor chip is mounted on a face-up BGA, which is the first insulating board; that a metal plate is bonded to one part of the face-up BGA on the solder ball mounting side; and that the metal plate is bonded to the first insulating board through the opening in the second insulating board, the heat dissipation of the face-up BGA, which is the first insulating board, can be improved.

Compared with the high heat-release MCM that employs a conventional ceramic board, the MCM of the present invention is structured by using the technique that provides for all the components that are to be mounted in the MCM to be attached to the surface by soldering, and as a result, the individual components can be more easily replaced. Further, since various packages and components to be mounted in the MCM are handled as single units, the manufacturing process is simplified and the manufacturing TAT can be shorter than that required by the high heat-release MCM that uses a conventional ceramic board.

When a face-up BGA is mounted on a printed board that has inferior heat dissipation, the present invention can provide a greater release of heat than that which is available in the conventional case, and it is possible to provide an MCM using a printed board that has a lower price and a shorter TAT than does a ceramic board.

The above and many other advantages, features and additional objects of the present invention will become manifest to those versed in the art upon making reference to the following detailed description and the accompanying drawings in which preferred embodiments incorporating the principles of the present invention are sown by way of illustrative example.

DETAILED DESCRIPTION OF THE PREFERRED EMBODIMENTS

The preferred embodiments of the present invention will now be described while referring to the accompanying drawings.

Figure 5:
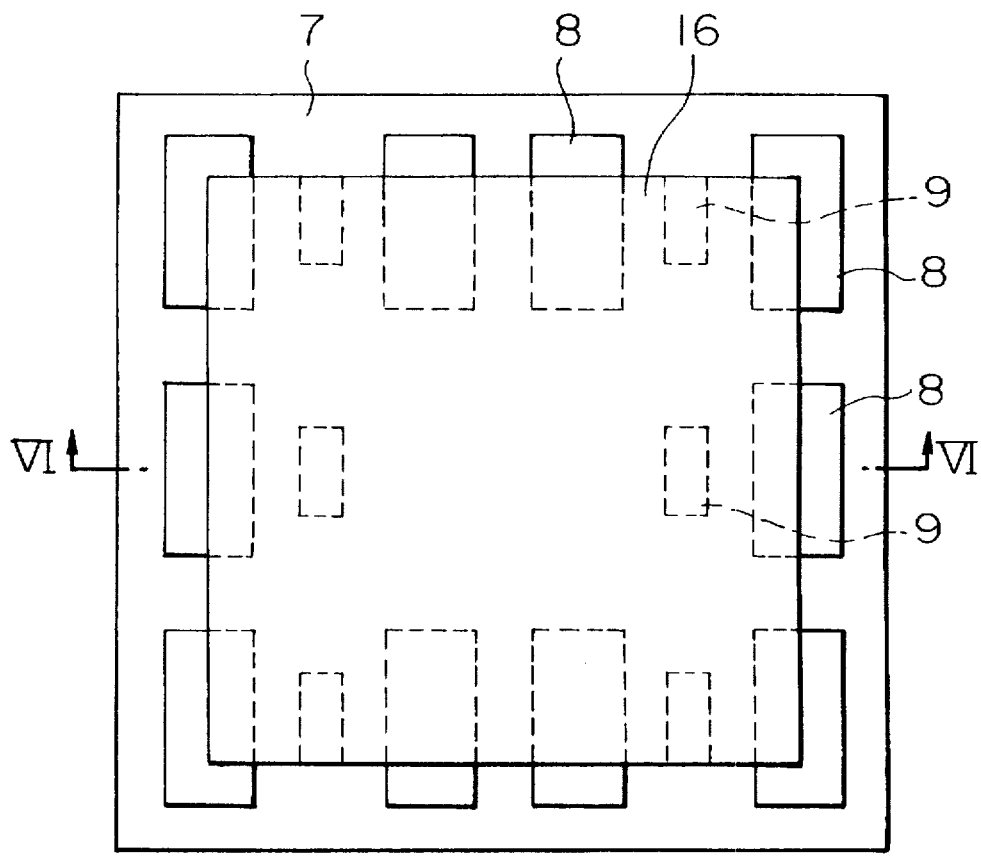
FIG. 5 is a plan view of a first embodiment of the present invention.
Figure 6:
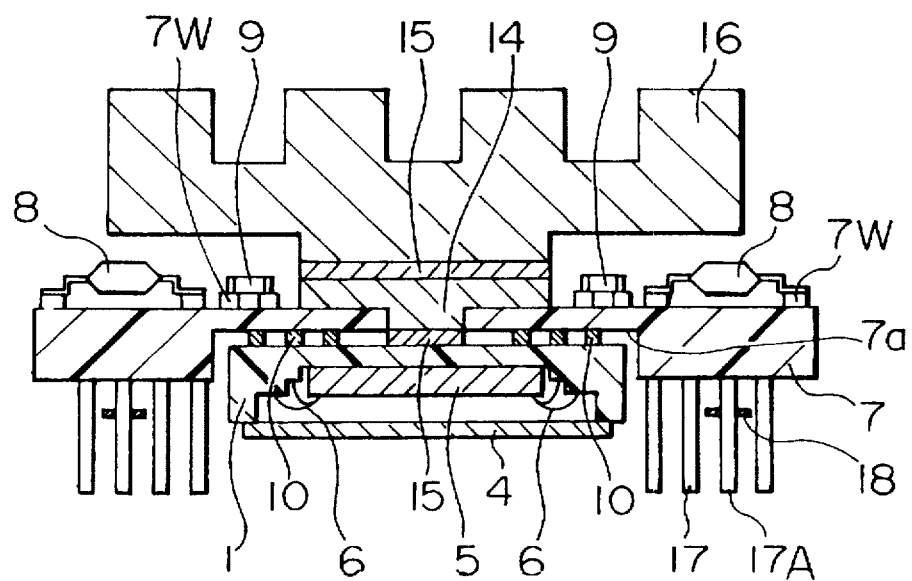
FIG. 6 is a vertical-sectional view taken along line VI—VI in FIG. 5.

FIG. 5 is a plan view of an MCM according to a first embodiment of the present invention, and FIG. 6 is a vertical-sectional view taken along line VI—VI in FIG. 5. The MCM shown in FIGS. 5 and 6 is manufactured according to the processing shown in FIG. 7.

First, a recessed portion is formed in an F/U C.BGA 1, which serves as a first insulating board formed of ceramic. A semiconductor chip 5 is mounted on the bottom of the recessed portion (the face directed downward in FIG. 6), which serves as a first surface. Two or more semiconductor chips can be so mounted, but in this embodiment, only one semiconductor chip is shown. A wiring layer pattern (not shown) is formed on the F/U C.BGA 1, and a plurality of portions of the wiring layer pattern are respectively connected to a plurality of pads (not shown) on a second surface (face directed upward in FIG. 6), which is positioned opposite to the first surface. The semiconductor chip 5 is mounted on the first surface, and the wiring layer pattern of the F/U C.BGA is connected to individual electrodes (not shown) on the semiconductor chip 5 by fine metal cables 6, such as wires. The resultant structure is sealed by a cap using a soldering material, such as gold solder, and eutectic solder balls 10 are formed and connected to the pads. As a result, the first insulating board assembly using the F/U C.BGA is constructed. Since the other electric components 8 and 9 are not mounted on the first insulating board assembly, a large ceramic board is not required for the first insulating board assembly, as is shown in FIG. 6, and thus, cracks do not occur on the board when the semiconductor chip 5 is mounted thereon.

Figure 1:
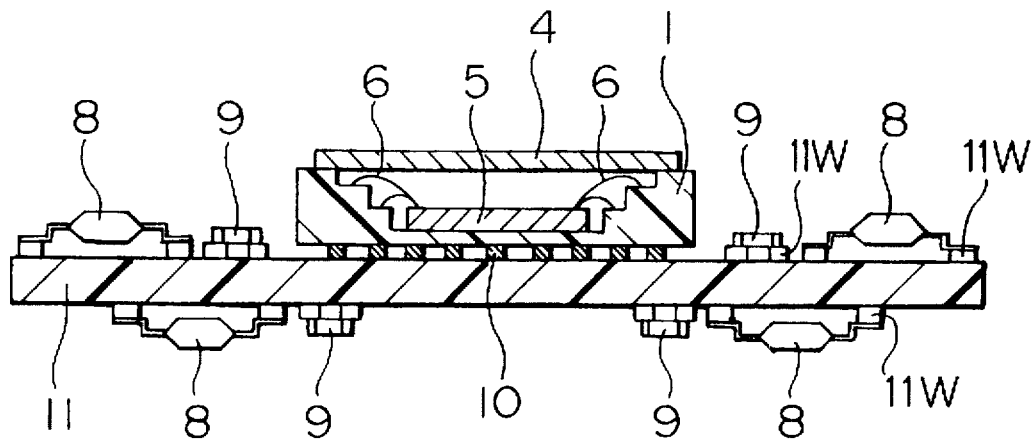
FIG. 1 is a vertical-sectional view of a first conventional embodiment.
Figure 2:
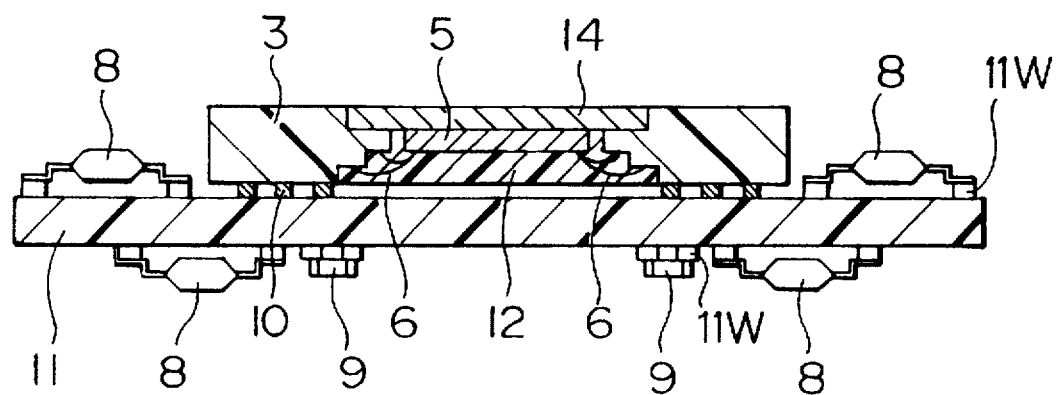
FIG. 2 is a vertical-sectional view of a second conventional embodiment.

In addition, since the solder balls 10 are formed and positioned on the surface opposite to that on which the semiconductor chip 5 is mounted, pads on which the solder balls are formed and to which they are connected can be also positioned inside the dimensions that corresponds to the circumference of the semiconductor chip 5, excluding the center portion to which a heat sink is attached. Thus, the structure can be made more compactly than the second conventional embodiment shown in FIG. 2.

Figure 3:
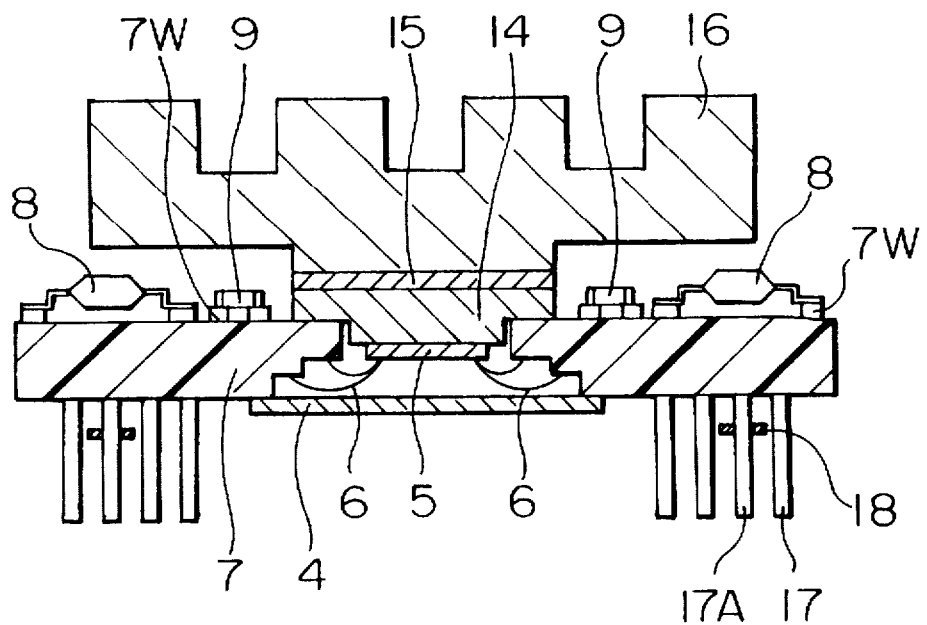
FIG. 3 is a vertical-sectional view of a third conventional embodiment.

Electric checking is conducted for the first insulating board assembly, for which the components can be treated as independent units, and good products are selected. During this checking, an insulating board assembly is abandoned when the semiconductor chip is found to have defects, including mounting failures and wire bonding failures. Since unlike the third conventional embodiment in FIG. 3 the expensive MCM ceramic board 7 on which the other electric components 8 and 9 are mounted is not abandoned, the incurred losses can be reduced to the minimum.

Printing is used to apply a coat of soldering paste (not shown) to the ceramic board 7, which is the second insulating board on which a wiring pattern is laid down and in which an opening is formed. Then, the selected first insulating board assembly that employs the F/U C.BGA and specific electric components, including the molded packages 8, such as memory, and the chip components 9, such as a chip capacitor, are mounted on the ceramic board 7 (a procedure for supplying "the first board assembly using an F/U C.BGA" (S-1A), "molded package components" (S-1B) and "chip components" (S-1C), and a procedure for mounting "the first insulating board assembly, the molded package components, and the chip components on the ceramic board" (S-2) in FIG. 7).

Figure 7:
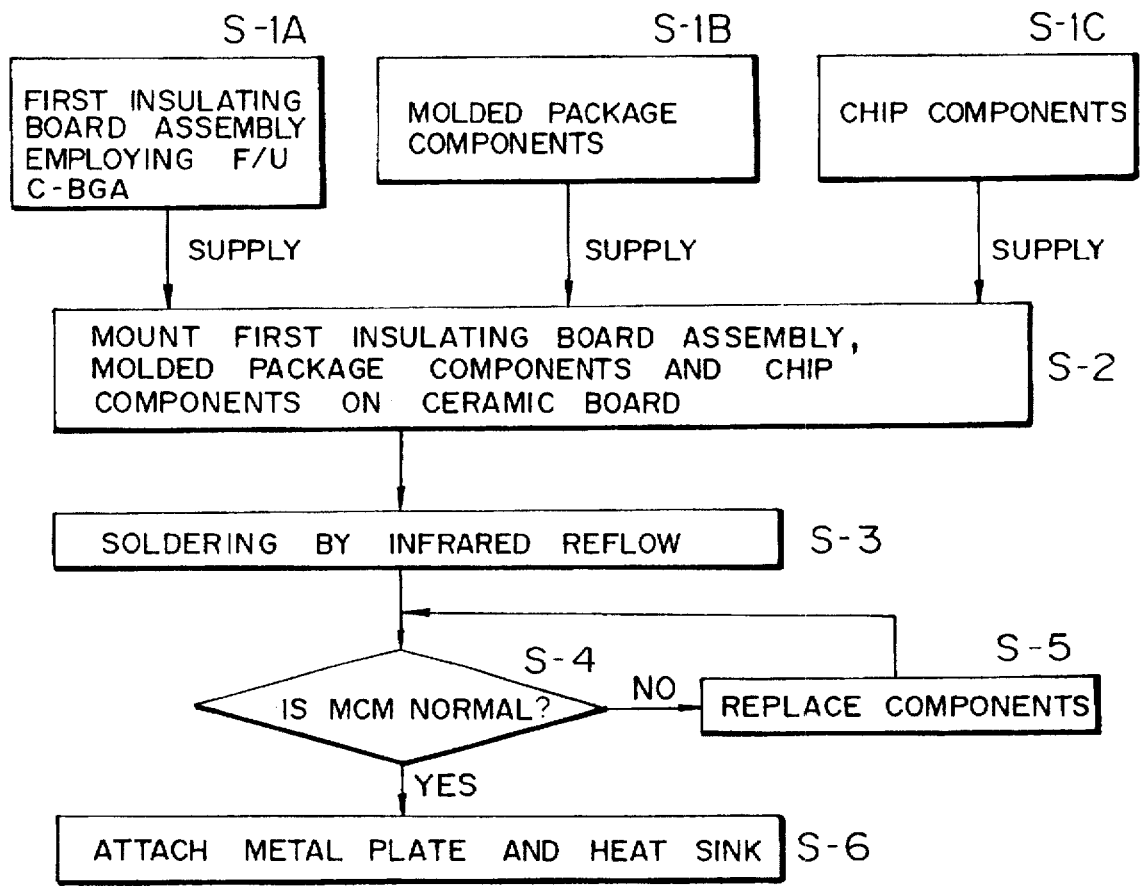
FIG. 7 is a flowchart showing a manufacturing process for the first embodiment of the present invention.

The ceramic board 7 is heated by an infrared reflow device to melt the solder, and the assembly, the components, and the portions of the wiring pattern on which they are mounted are soldered to each other (a procedure for "soldering by infrared reflow" (S-3) in FIG. 7). In other words, the wiring pattern of the printed board 7 is mutually connected to the solder balls 10 of the assembly, the electrode pads of the individual components, and external leads 17. Of the wiring pattern on the printed board, only wiring portions 7W to which the electric components 8 and 9 are connected are shown in FIGS. 5 and 6, with wiring portions to which are connected the pads of the F/U C.BGA 1 and the solder balls 10 not being shown. In the structure shown in FIGS. 5 and 6, the F/U C.BGA 1 is mounted on the side where the external leads 17 are connected. In this case, a cavity portion 7a is formed in the ceramic board 7, which is the second insulating board, in order to acquire the appropriate length for the external leads 17, and the first insulating board assembly that employs the F/U C.BGA is mounted in the cavity 7a (from below in FIG. 6). Included in the external leads 17 is an external lead 17A that has a stopper 18 for maintaining a predetermined height when the leads 17 are attached to the other board.

Following this, checking of the MCM is conducted whether the MCM is normal or not (an "MCM checking" procedure (S-4) in FIG. 7). For a defective MCM, its first insulating board assembly or its components that are regarded as defective are replaced (a "component exchange" procedure (S-5) in FIG. 7). Then, an MCM having no defects can be provided.

A metal plate 14 formed of copper, etc., is arranged in the opening in the ceramic board 7 of an MCM that is selected as a good product. The metal plate 14 is then bonded with an adhesive 15, such as a silicon resin, to the central region where there are no solder balls 10, of the surface, of the F/U C.BGA 1 (the first insulating board assembly) that is mounted on the ceramic board 7, that is opposite the surface on which the semiconductor chip 5 is mounted. Also, the metal plate 14 and the ceramic board 7 are bonded together by the adhesive 15. In addition, a heat sink 16 is bonded to the metal plate 14 using the adhesive 15 so as to effectively dissipate heat that is generated by the semiconductor chip 5 (a "heat sink attachment" procedure (S-6) in FIG. 7).

As is described above, the surface-attachment technique is employed for the various packages and components that are to be mounted in the MCM. Therefore, if the MCM in this embodiment is found to have a defect due to the installed semiconductor chip 5, only the first insulating board assembly that employs the F/U C.BGA, which is handled as a single unit, need be exchanged, with the result that the semiconductor chip. 5 can be replaced more easily than in the conventional case, and the expensive MCM ceramic board 7 need not be abandoned.

In addition, since an F/U C.BGA that is smaller than the ceramic board 7 is employed, there is seldom sufficient stress applied to generate a high heat when, for example, the semiconductor chip 5 is mounted, and accordingly, cracks seldom occur.

Figure 4:
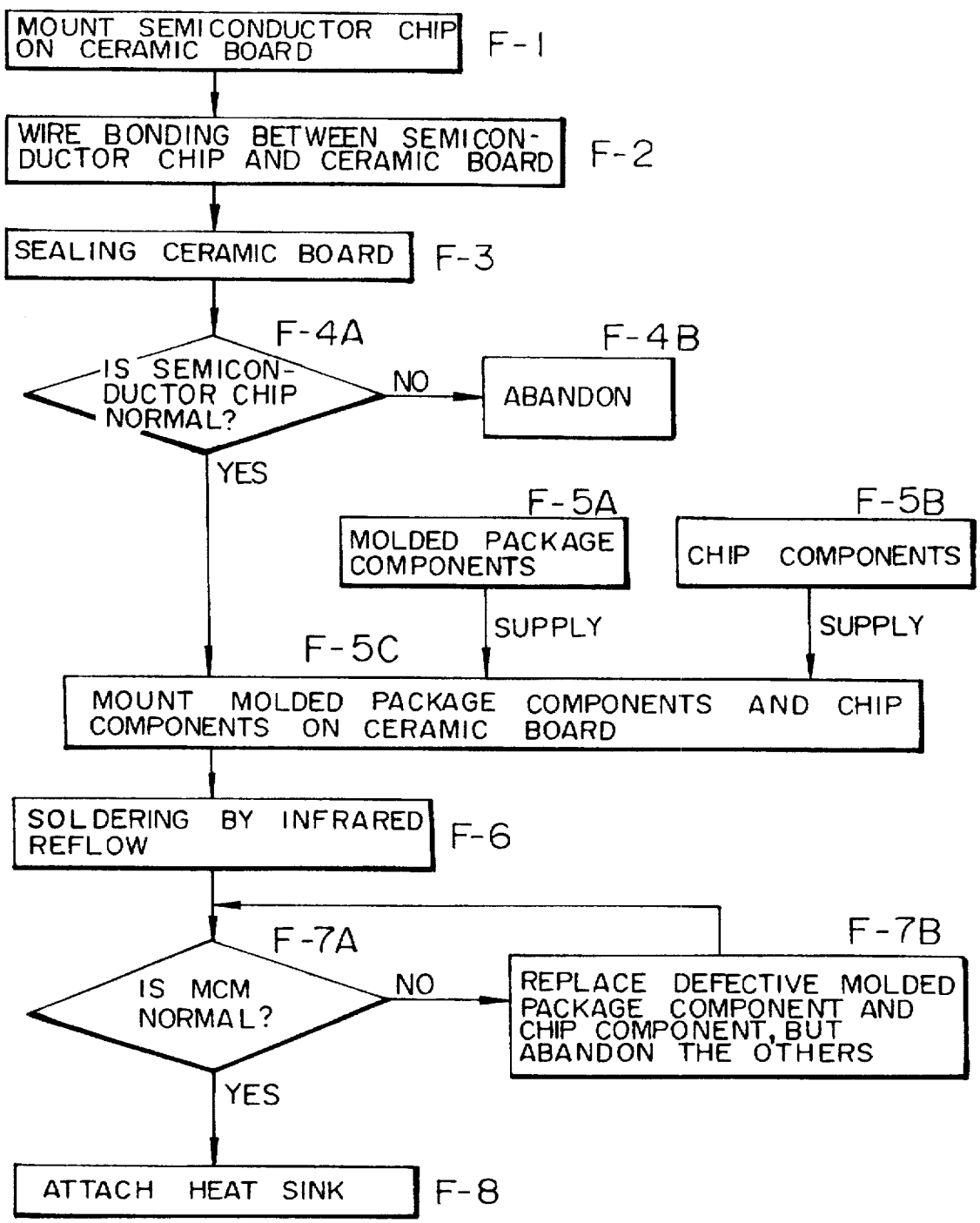
FIG. 4 is a flowchart of a manufacturing process for the conventional embodiment shown in FIG. 3.

Further, as is shown in the manufacturing processing in FIG. 7, since the process is simplified and employs procedures whereby, basically, good products are supplied from stocks of various packages and chip components, and whereby the packages and chip components are soldered to the ceramic board 7, which is a motherboard, the manufacturing TAT can be reduced compared with that required by the manufacturing processing for the third conventional example in FIG. 4.

Although the first embodiment has been specifically explained, the present invention is not limited to this embodiment, and can be variously modified within the scope of the invention. For example, various other methods can be employed for the bonding of the F/U C.BGA 1, which is the first insulating board, the ceramic board 7, and the metal plate 14, and various other materials can be employed for the solder balls 10 for connecting the F/U C.BGA 1 to the ceramic board 7.

Figure 8A:
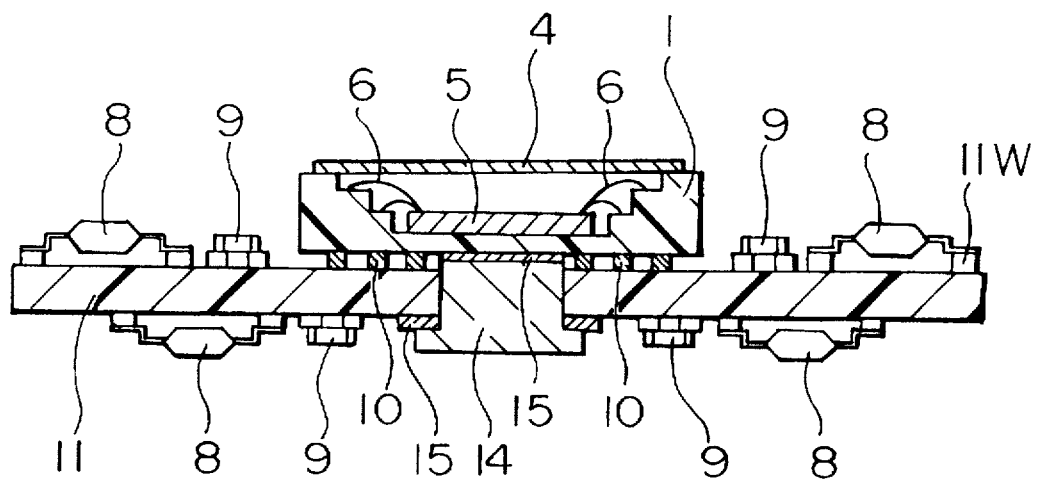
FIGS. 8A and 8B are respective vertical-sectional views of a second embodiment of the present invention and its modification.
Figure 8B:
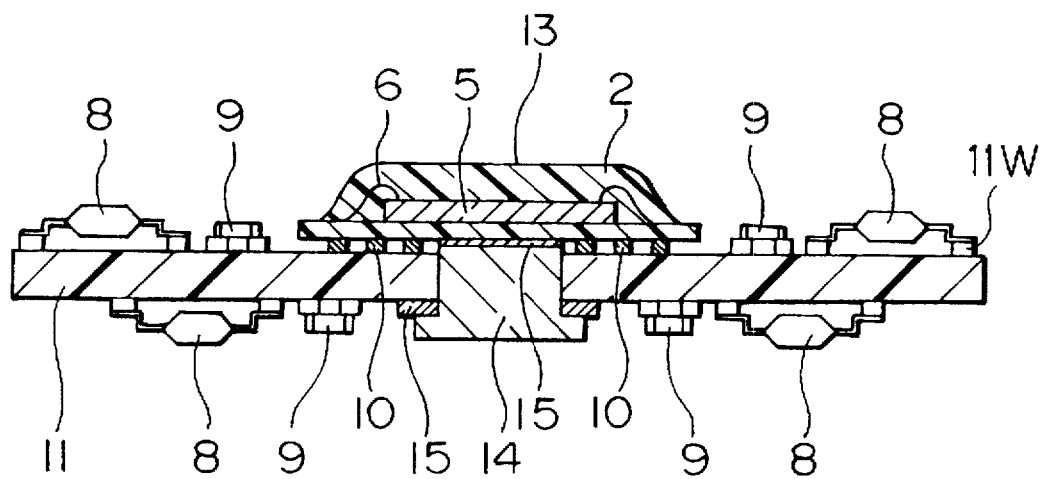

A second embodiment of the present invention and its modification will now be described while referring to the drawings. FIGS. 8A and 8B are respective vertical-sectional views of the second embodiment of the present invention and its modification. The same reference numerals as are used in FIG. 6 are also used in FIGS. 8A and 8B to denote corresponding or identical components, and no explanation for them will be given.

The MCMs in FIGS. 8A and 8B differ from the MCM of the first embodiment in FIGS. 5 and 6 in that: in FIGS. 5 and 6, the F/U C.BGA 1 is mounted in the cavity, on the external lead 17 side, of the ceramic board 7, which is a PGA (Pin Grid Array), and the metal plate 14 is connected to the ceramic board 7 and one part of the solder ball forming surface of the F/U BGA 1 in order to enhance heat release; while, according to the MCMs in FIGS. 8A and 8B, an F/U C.BGA 1 and an F/U P.BGA 2 are mounted on a flat surface of a printed board of glass epoxy in which no cavity is formed.

For both of the MCMs in FIGS. 8A and 8B, on both surfaces of a printed board 11 are mounted various molded package components 8, such as memory and a microcomputer; chip components 9, such as a chip capacitor; and a first insulating board assembly using the F/U C.BGA 1 or the F/U P.BGA 2. Soldering of these components is performed with an infrared reflow device or the like.

A metal plate 14 made of copper is arranged at the opening in the printed board 11. An adhesive 15, such as an epoxy resin, is then used to fix the metal plate 14 to the center portion, on which there are no solder balls 10, of the surface, of the F/U C.BGA 1 or the F/U P.BGA 2 that is mounted on the printed board 11, that is opposite the surface on which a semiconductor chip 5 is mounted. The face-up BGA is attached to the printed board in this manner to provide the MCMs in FIGS. 8A and 8B. In the same manner as for the MCM in FIGS. 5 and 6, a heat sink (not shown) is located on the metal plate 14 in order to effectively facilitate the release of heat that is generated by the semiconductor chip 5.

Whereas it is difficult for a high heat release semiconductor to be mounted on a conventional face-up BGA chip, a high heat release semiconductor chip can not only be mounted on a face-up BGA of this embodiment, but can provide an enhanced heat release function when compared with the conventional equipment, even when the face-up BGA is mounted on a printed board having a thermal conductivity that is inferior to that of ceramic. The use of the face-up BGAs is thus expanded, and inexpensive MCMs that require a short TAT can be provided.

What is claimed is:

1. A multi-chip module comprising:

a first insulating board having a first surface and a second surface that is positioned opposite to said first surface;

at least one semiconductor chip mounted on said first surface of said first insulating board;

a plurality of metal connection members arranged on said second surface of said first insulating board;

a second insulating board that is connected to said plurality of metal connection members;

a metal plate that is securely attached to one part of said second surface of said first insulating board through an opening in said second insulating board; and electric components mounted on a surface of said second insulating board.

2. A multi-chip module according to claim 1, wherein said metal connection members are solder balls.

3. A multi-chip module according to claim 1, wherein a recessed portion is formed in said first insulating board, and wherein a bottom of said recessed portion serves as said first surface on which said semiconductor chip is to be mounted.

4. A multi-chip module according to claim 1, wherein said semiconductor chip is sealed by a cap.

5. A multi-chip module according to claim 1, wherein said semiconductor chip is sealed by resin.

* * * * *